United States Patent [19]

Anantha et al.

[11] 4,389,281
[45] Jun. 21, 1983

[54] METHOD OF PLANARIZING SILICON DIOXIDE IN SEMICONDUCTOR DEVICES

[75] Inventors: Narasipur G. Anantha, Hopewell Junction; Harsaran S. Bhatia; John S. Lechaton, both of Wappingers Falls; James L. Walsh, Hyde Park, all of N.Y.

[73] Assignee: International Business Machines Corporation, Armonk, N.Y.

[21] Appl. No.: 217,077

[22] Filed: Dec. 16, 1980

[51] Int. Cl.³ .................... H01L 21/306; C03C 15/00
[52] U.S. Cl. ................................. 156/646; 156/659.1; 156/661.1; 156/662; 430/313; 252/79.3
[58] Field of Search ................ 156/646, 659.1, 661.1, 156/662, 668, 657; 252/79.3; 430/313, 317, 319; 427/93; 29/580; 55/16

[56] References Cited

U.S. PATENT DOCUMENTS

| 3,976,524 | 8/1976 | Feng | 430/317 |
|---|---|---|---|
| 4,127,437 | 11/1978 | Bersin et al. | 430/313 |
| 4,239,793 | 12/1980 | Matsuura et al. | 55/16 |
| 4,307,179 | 12/1981 | Chang et al. | 156/661.1 |

FOREIGN PATENT DOCUMENTS 2350937 5/1977 France .............................. 156/646

OTHER PUBLICATIONS

Bersin, R. L., & Reichelderfer, R. F., "The DryOx Process for Etching Silicon Dioxide", *Solid State Technology*, vol. 20, No. 4, (Apr. 1977), pp. 78–80.
Ru et al, "A New Conformal Dry-Etch Technique for Submicrometer Structures", *J. Vac. Sci. Technol.*, 19(4) (Nov./Dec. 1981), pp. 1385–1389.
*IBM Tech. Disclosure Bulletin*, vol. 22, No. 9, (2/80), "Method for Improving Reliability of Schottky Diodes", by Anantha et al, pp. 4042–4043.
Process for Providing Deep Trench Silicon Isolation, Burkhardt et al, *IBM Technical Disclosure Bulletin*, vol. 22, No. 5, Oct. 1979.
Dielectric Isolation Planarization, Bartush, Pogge, Wilsarg, *IBM Technical Disclosure*, vol. 21, No. 5, Oct. 1978.

*Primary Examiner*—William A. Powell
*Assistant Examiner*—F. K. Wine
*Attorney, Agent, or Firm*—Sughrue, Mion, Zinn, Macpeak & Seas

[57] ABSTRACT

The present invention provides a method for planarizing a non-uniform thickness of oxide, for example silicon dioxide as is formed over oxide-filled trenches used in deep dielectric isolation in integrated circuits. The oxide is removed by a planarizing resist-etching process so that etching in thicker resist areas proceeds at a rate slower than etching in thinner resist areas. A referred etchant is HF gas and etching is preferably at an elevated temperature.

6 Claims, 7 Drawing Figures

METHOD OF PLANARIZING SILICON DIOXIDE IN SEMICONDUCTOR DEVICES

BACKGROUND OF THE INVENTION

1. Field of the Invention

The present invention relates to a method of planarizing silicon dioxide in semiconductor devices, e.g., silicon dioxide in deep and shallow trenches in semiconductor devices.

DEVELOPMENT OF THE INVENTION

With the development of large scale integration where a plurality of devices are formed in/or on a semiconductor substrate, the technique of planarization of integrated circuit surfaces, particularly dielectric or electrically insulating materials used for passivation, isolation and electrical insulation, has increasingly been carried out.

Dielectrically isolated integrated circuits are often characterized by patterns of what are termed trenches extending from the surface of the integrated circuit to the interior thereof to isolate various devices or parts of a device electrically. Where a dielectric or insulating material is deposited in such a trench, this can lead to a highly irregular surface on the integrated circuit which, if excessive, can lead to various problems including breaks or defects in a metallization pattern deposited on the surface of the device. The non-planarity of substrates, resulting from the dielectric isolation process just described, becomes aggravated as multiple layers of insulation and conductors are deposited thereover, as is often the case. It is, therefore, very important that the substrate containing dielectrically isolated devices be as planar as possible for the overlying multi-level metal pattern structure.

Various types of trenches are known in the art. For example, deep narrow trenches are typically used to isolate one device from another device in an integrated circuit, for example, to isolate one bipolar transistor from another bipolar transistor.

In a similar fashion, shallow trenches are utilized to isolate individual elements within a device, for example, to isolate the base from the collector in a bipolar transistor.

Deep wide trenches are also commonly used in the art, and serve as areas where metallization patterns will be carried on the surface of the integrated circuit.

Typically such trenches are filled with silicon dioxide or silicon nitride, and it is quite common in the art to form such by chemical vapor deposition (CVD).

While the depth and width of such trenches can vary widely, and will be affected by the thickness of the epitaxial layer in which they are typically formed, usually a deep trench will have a depth on the order of 4 to 6 microns, with a deep narrow trench being about 2 to 4 microns wide and a deep wide trench being anywhere from about 20 to 100 microns wide.

In distinction, shallow trenches are typically on the order of 1 to 2 microns wide and on the order of 0.5 to 2 microns deep.

When silicon dioxide is deposited by chemical vapor deposition (CVD), a technique described in "Local Oxidation of Silicon and Its Applications in Semiconductor Device Technology", J. A. Appels, et al, Phillips Research Reports 25, page 118, (1970), a conformal coating results, i.e., a coating which basically follows the topography of the substrate on which the coating is deposited. While such a conformal coating often does not create problems when a deep narrow trench or a shallow trench is being filled with CVD deposited silicon dioxide, substantial problems can be encountered where CVD deposited silicon dioxide is used to fill a deep wide trench since a "pocket" or depression is created over the trench which can lead to metallization pattern defects.

In order to avoid the occurrence of such "pockets" over deep wide trenches, and to avoid irregular integrated circuit surfaces which can lead to device defects, the technique of planarization has been developed in the art.

For example, U.S. Pat. No. 3,976,524 Feng discloses a planarization technique where a photoresist is used to mask "unelevated areas" while "elevated" areas which are not covered with the photoresist are etched. The present invention involves no selective removal of a photoresist as is contemplated in Feng.

U.S. Pat. No. 4,025,411 Hom-ma et al discloses a planarization technique where a substrate is covered with a material having an etch rate approximately the same as that of the material which is to be etched, whereafter physical etching such as RF sputtering is conducted until the desired substrate is etched. The present invention does not involve the etching of such a material, e.g., in accordance with the present invention only the material used to fill a trench is selectively etched.

U.S. Pat. No. 4,073,054 Kaji et al is quite similar to Hom-ma et al, above discussed, in concept except that two electrical insulators are used, the second deposited electrical insulator being etched at a rate approximately the same as that of the first electrical insulator which is deposited, Kaji et al again using physical etching.

U.S. Pat. No. 4,076,860 Kuroda discloses a planarization technique involving the use of two photoresist layers where a combination of photolithographic exposures and plasma etching is utilized to planarize. The present invention does not involve such a combination of processing steps.

U.S. Pat. No. 4,089,766 Paal et al discloses a planarizing technique where a layer of a polymer material is applied on a semiconductor substrate as well as on a metallization pattern, the polymer layer is cured and removed down to a thin layer and, after a second curing, a quartz layer is applied to the polymer layer, whereafter a photoresist layer is applied to the quartz layer. The present invention does not involve the complicated processing sequence of Paal et al.

"A Defect-Free Isolation Technology for High Density N-Channel MOS LSI's" by T. Shibata et al, Int. Electron Devices Meeting, Dig. Tech. Papers, pp 1–4, 1978, discloses resist-catalytic etching of silicon dioxide with hydrogen fluoride gas. However, Shibata et al in no fashion teach the concept of planarizing as per the present invention, rather, Shibata et al merely open a window in a silicon dioxide layer carried on a silicon substrate with all oxide being removed.

BRIEF SUMMARY OF THE INVENTION

The present invention provides a method for planarizing non-uniform thicknesses of oxides, for example, such as are formed over oxide-filled trenches used in deep dielectric isolation. The oxide is removed by a planarizing resist-etching process so that etching in thicker resist areas proceeds at a rate slower than etching in thinner resist areas.

DESCRIPTION OF PREFERRED EMBODIMENTS

The present invention will be explained with reference to the attached drawings.

In the following, the present invention is described in detail with reference to typical LSI integrated circuit where the active devices to be formed are bipolar transistors.

It should be understood, of course, that while various dopants, coating layers, processing conditions and the like are set forth the present invention is not to be limited thereto, rather, the present invention is of wide application in planarizing silicon dioxide surfaces in general, though the invention is of particular application to planarization of integrated circuits comprising one or more trenches filled with dielectric silicon dioxide.

Figure 1:
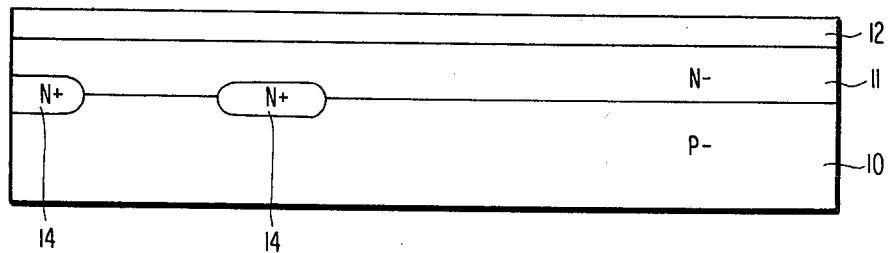
FIGS. 1–7 schematically illustrate a typical process for planarizing a silicon dioxide layer following the procedure of the present invention.

With reference to FIG. 1, a P− silicon substrate 10 doped with boron to a concentration of about $10^{14}$ atoms/cm$^3$ is shown having an N− epitaxial (hereafter merely epi) layer 11 formed thereon about 1 micron thick. The epi layer 11 is doped with arsenic to a concentration of about $2 \times 10^{16}$ atoms/cm$^3$. The substrate 10 is doped and the epi layer 11 grown and doped by conventional procedures as described in U.S. Pat. No. 4,196,440 Anantha et al. The epi layer 11 has grown thereon an SiO$_2$ reox layer 12 by a conventional reoxidation process by dry (inert gas)-wet (steam at 1000° C., 90 minutes)-dry (inert gas) reoxidation to a total thickness of 3,000–4,000 Å.

After deep narrow trench formation as later described, of course an active device such as a bipolar transistor will be formed in epi layer 11 in a conventional fashion. For illustration, N+ sub-collectors 14 formed in a conventional manner are schematically shown in FIG. 1 (conventional ion implantation: $10^{18}$ atoms/cm$^3$ of As).

Figure 2:
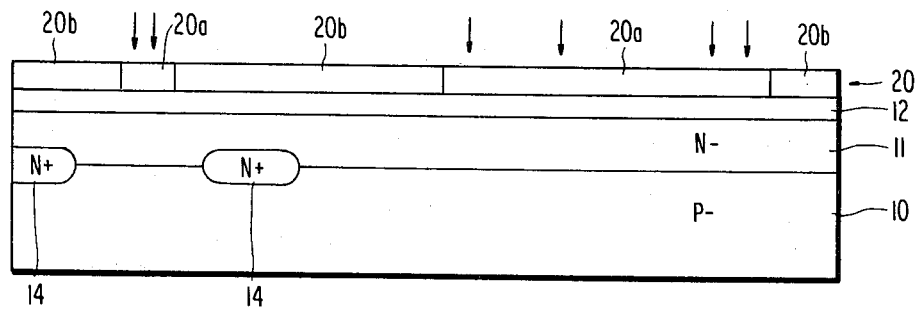

In FIG. 2 a conventional positive resist layer 20 (such as AZ 1350J, trade name of Shipley Company) is applied to SiO$_2$ layer 12 by spin coating, solvent being driven off, to a dry thickness of about 1 micron, the photoresist layer being masked with a conventional mask (not shown) and exposed as shown by the arrows to ultraviolet light in a conventional manner to provide exposed, polymerized, etchable portions 20a and unexposed, unpolymerized, unetchable portions 20b. Other useful conventional positive photoresists include AZ 1350 H (tradename of Shipley Company), or AZ 111 (tradename of Shipley Company). Az 1350 J is 3,4-dihydroxybenzophenone-4-[naphthoquinone-(1,2)diazide(2)]-sulfonate, typically dissolved in ethylene glycol-monoethyl ether acetate.

Figure 3:
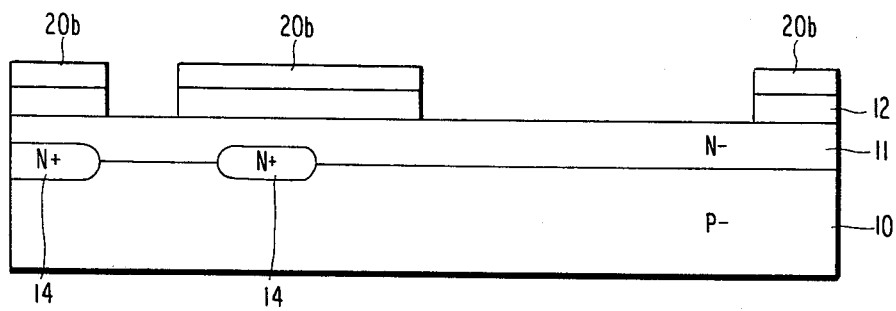

In FIG. 3 resist areas 20a are removed in a conventional manner with a conventional liquid developer, such as AZ Developer (trade name of Shipley Company); when AZ 1350 J is used, the device is typically contacted with AZ Developer for 10–15 minutes at room temperature and then washed with water. Thereafter SiO$_2$ layer 12 which is exposed after removal of photoresist areas 20a is removed by conventional reactive ion etching using CF$_4$/H$_2$ at a 20–40 SCCM flow rate, 30 watts being used for a 11 inch diameter system. This system has a high silicon dioxide:photoresist etch ratio so the silicon dioxide layer 12 is preferentially removed in areas where exposed photoresist 20a has been removed.

Reactive ion etching as is utilized in the present invention is described in detail in "A Survey of Plasma-Etching Processes" by Richard L. Bersin, published in Solid State Technology, May 1976, pages 31–36. As will be appreciated by one skilled in the art, the atmospheres utilized for RIE will vary depending upon the material being etched, and the Bersin article describes such in detail and is incorporated herein by reference.

Figure 4:
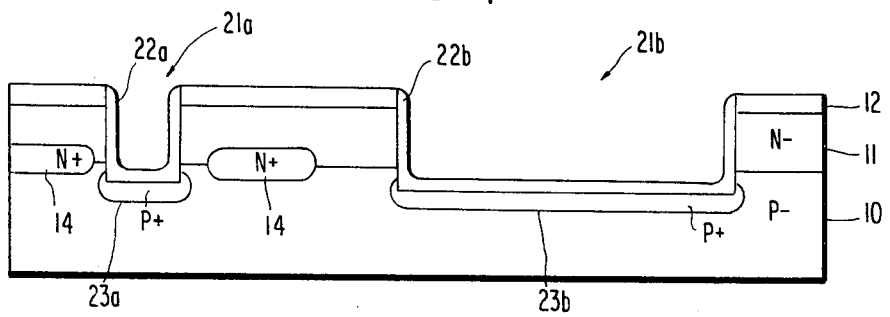

As shown in FIG. 4, following resist removal in areas 20b by a conventional plasma etch with oxygen (resist layer 20b merely "ashes" off), trenches 21a and 21b are formed through the N− epi layer 11 into the P− substrate 10. Trench 21a is a deep narrow trench for device isolation whereas trench 21b is a deep wide trench which will eventually carry a metallization pattern. Trench formation can be done by plasma etching using 3% chlorine in argon, 40 watts, flow of 10 SCCM at a pressure of 10 millitorrs for an 8 inch diameter system. The etch rate is about 350 Å/minute and the Si:SiO$_2$ etch ratio is about 6:1. In FIG. 4 deep narrow trench 21a is about 4–4.5 microns deep and about 2–2.5 microns wide whereas deep wide trench 21b is about 4–4.5 microns deep and about 100 microns wide.

Following etching, SiO$_2$ is regrown in trenches 21a and 21b to provide SiO$_2$ layers 22a and 22b of a thickness of about 500 Å. While SiO$_2$ regrowth is optional, it does prevent sideward diffusion during later described boron implantation. Regrowth is by thermal oxidation at about 950° C. for about 20 minutes in an oxidizing gas (O$_2$) to form such a 500 Å layer.

Following SiO$_2$ regrowth, a standard ion implantation is conducted and boron is diffused into trenches 21a and 21b for isolation. The ion implantation is highly directional in the vertical direction and is performed at 30 KEV to provide a boron concentration of $1 \times 10^{12}$ atoms/cm$^2$, as shown by 23a and 23b in FIG. 4.

As will further be apparent to one skilled in the art, deep narrow and deep wide tranches are typically formed simultaneously; not shown in FIG. 4 are shallow trenches, but it will also be apparent to one skilled in the art that shallow trenches are formed using a procedure similar to that above described for forming the deep trenches in FIGS. 1–4. Of course, in actual LSI processing typically many more trenches, both of the deep and shallow type, will be utilized. Thus, it should be understood that the Figures are merely a schematic representation of the present invention.

Figure 5:
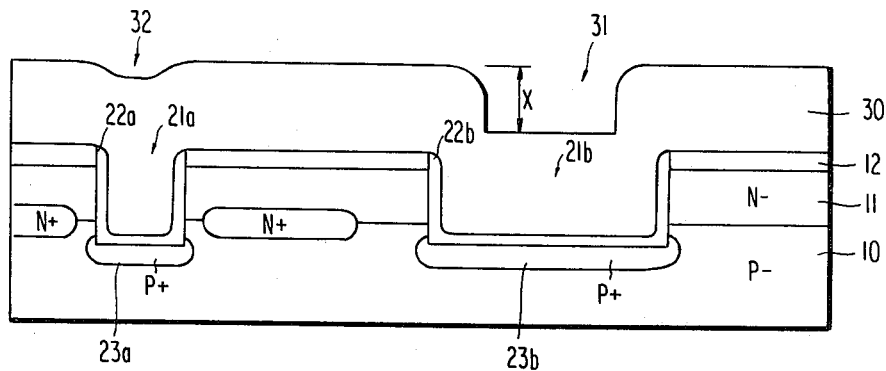

In order to fill the deep narrow trenches 21a and the deep wide trench 21b with a dielectric isolation material, as shown in FIG. 5 a CVD SiO$_2$ layer 30 is deposited in a conventional fashion. Since CVD SiO$_2$ is conformal, as the CVD SiO$_2$ layer 30 is deposited a "pocket" or depression 31 is formed over the deep wide trench 21b which is of substantial magnitude, whereas pocket 32 formed over deep narrow trench 21a is very small. Pocket 31 is represented in FIG. 5 as having depth X; depth X will, of course, be on the order of 4–4.5 microns since CVD SiO$_2$ layer 30 is conformal.

It is pocket 31 which leads to the major necessity to planarize since if a metallization pattern is deposited over deep wide trench 21b, the metallization pattern can sink into pocket 31 and a break in the metallization can occur.

Thus, it is necessary to planarize the surface of a device as shown in FIG. 5 so that, essentially, the CVD SiO₂ layer 30 is removed down to the surface of N⁻ epi layer 11. At the same time, it is undesirable to excessively etch so that N⁻ epi layer 11 will be removed as, in this instance, one is beginning to remove areas where active devices will be or will eventually be formed in N⁻ epi layer 11.

The present invention provides a method for effecting such planarization which is simple, easy to practice and which can be accurately controlled without excessive etching of N⁻ epi layer 11, as will now be explained with respect to FIG. 6.

Figure 6:
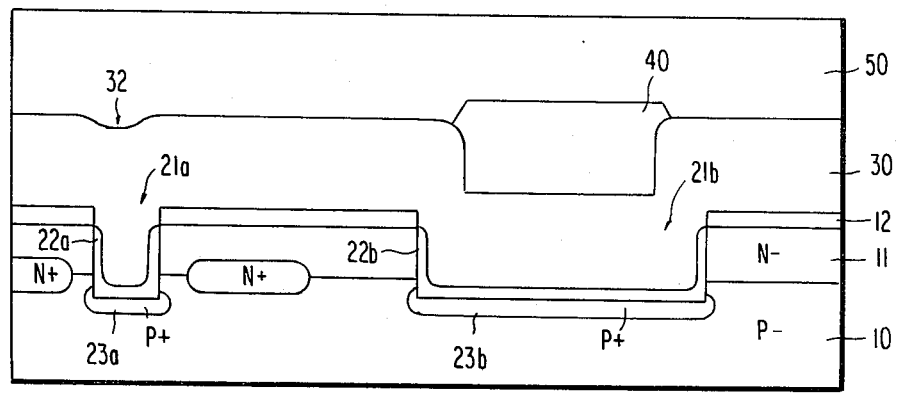

With respect to FIG. 6, in the embodiment shown a two-step photoresist coating is utilized. In actuality, a two-step coating is optional, but it has been found that if first photoresist "plug" 40 is used it is much simpler to ensure that the second photoresist "overcoat" 50 has a uniformly flat surface. In certain instances if the first photoresist plug 40 is not used, then occasionally as a single coat photoresist cures a depression will occur over deep wide trench 21b. By first forming plug 40, it is much easier to flow overcoat 50 in a uniform fashion.

In the instance that the plug 40 is a positive photoresist, then overcoat 50 should be a negative photoresist since thinner oxide layers can be processed. However, both the plug and overcoat can be a negative photoresist as will latter be discussed.

Positive photoresist which can be used to form plug 40 include AZ 1350, J, AZ 1350 H and AZ 111 (all tradenames of Shipley Company), with AZ 1350 J being preferred. The nature of the positive and negative photoresists is not especially limited.

Negative photoresists which can be used include those of the cyclized polyisoprene type such as KTFR (tradename of Eastman Kodak Chemical Company) and KMER (tradename of Eastman Kodak Chemical Company), OMR (tradename of Tokyo Ohka Kogyo Co., Ltd.), and Waycote (tradename of Philip A. Hunt Chemical Company). The preferred negative photoresist is KTFR.

With respect to the preferred embodiment, and referring to FIG. 6, firstly a positive photoresist such as AZ 1350 J is uniformly applied so as to fill depression 31 shown in FIG. 5 and thereafter exposure through an appropriate mask carried out so that following development in a conventional manner plug 40 fills depression 31 in CVD SiO₂ 30.

Following the above procedure, a negative photoresist is coated over the entire surface to be etched to yield overcoat 50 and thereafter blanket exposure of overcoat 50 is carried out, all in a conventional manner.

Usually if a deep trench has a width of about 25 microns or more, the plug/overcoat procedure described above is followed. However, for deep wide trenches having a width of less than about 25 microns, a single layer photoresist can be used, and in this case a negative photoresist as above exemplified is preferably used.

Following the above photoresist coating, etc., etching in accordance with the present invention can be conducted.

With reference to FIG. 6, the concept of the present invention with respect to etching will be explained. Firstly, the objective of etching, as earlier indicated, is to remove CVD SiO₂ layer 30 in a fashion such that etching terminates at the top of N⁻ epi layer 11. If etching were merely to be conducted without a photoresist, it can easily be seen that due to depression 31 shown in FIG. 5 when thickness X as shown in FIG. 5 of CVD SiO₂ 30 is removed a similar amount of CVD SiO₂ 30 would be removed which has been deposited in the deep wide trench 21b, whereby the CVD SiO₂ 30 in the deep wide trench would be non-planar.

While we do not wish to be bound by any particular theory as to mechanism, we have discovered that the etch rate of a CVD SiO₂ coating such as coating 30 varies with resist thickness, i.e., at thicker resist areas the etch rate is slower than at thinner resist areas. Thus, with reference to FIG. 6, the etch rate of CVD SiO₂ 30 under plug 40 will be relatively slow as compared to the etch rate of CVD SiO₂ coating 30 at the area above the deep narrow trench 21a since in the former situation the total photoresist thickness includes plug 40 and overcoat 50 while in the latter siutation the total resist thickness is only that of overcoat 50.

Thus, etching of SiO₂ will proceed relatively slowly over deep wide trench 21b while it will proceed relatively rapidly over deep narrow trench 21a, whereby following the termination of etching only a relatively small amount of CVD SiO₂ coating 30 is removed over deep trench 21b whereas in the same period of time a relatively large amount of SiO₂ is removed over deep narrow trench 21a, the objective being to etch to form a planar surface which terminates at the top of N⁻ epi coating 11.

As will be apparent to one skilled in the art, resist thickness must thus be correlated with the thickness of CVD SiO₂ layer 30 over a deep narrow trench and over a deep wide trench and that as resists are varied resist thicknesses and etch rates must be empirically determined. However, this can easily be done by, for example, applying the resist system to be used at varying thicknesses and then conducting etching at the desired conditions within the ranges set forth below with a simultaneous measurement of etch rate.

A further aspect of the present invention involves the use of a plurality of photoresists, i.e., different photoresists which have different etch rates. For example, and referring to the data below if AZ 1350 J is used in combination with KTFR, it will be apparent to one skilled in the art that since KTFR provides an etch rate about 4–5 times as rapid as that of AZ 1350 J at equal thicknesses, if the area over, for instance, a deep wide trench is protected by AZ 1350 J, whereas the balance of the device is merely protected by KTFR, the etch ratio will be about 4–5:1 in KTFR protected areas as opposed to AZ 1350 J protected areas.

Exemplary etch rates which we have encountered in processing in HF gas at 165° C. and 18 torr are set forth below:

| Resist Thickness | AZ 1350 J | KTFR |
|---|---|---|
| 0.5 μm | | ca. 2000 Å/min. |
| 1.0 μm | | ca. 1600 Å/min. |
| 2.0 μm | ca. 250 Å/min. | ca. 1000 Å/min. |

Thus, in a "plug"/"overcoat" photoresist system the etch rate of CVD SiO₂ under an AZ 1350J plug will be approximately 20–25% that under a KTFR area. In this regard, it can be seen that the photoresist which provides the slower CVD SiO₂ etch rate is basically etch rate controlling with respect to CVD SiO₂ areas thereunder and the effect of any overcoated photoresist which provides a faster etch rate can essentially be ignored.

It should be understood, of course, that the present invention is not limited in a "plug/overcoat" system to the use of AZ 1350J and KTFR but can be practiced with any combination of photoresists, albeit preferably the etch rates provided by the two photoresists differ since this makes process control of the total etched amount over a deep trench simpler. As will be appreciated by one skilled in the art the exact differential in etch rates is not critical and can be freely valued but etch rates on the order of 4–5:1 as above offer excellent results in typical state of the art LSI devices. For example, where relatively less CVD $SiO_2$ is to be removed over a deep wide trench a photoresist plug providing a slower etch rate might be used, etc.

Similar concepts apply in the situation where a monolayer photoresist is used. Thus, assuming that a CVD $SiO_2$ layer 10,000 Å thick is formed and assuming KTFR is the photoresist used, the resist thickness over deep narrow trenches should be on the order of 0.5 $\mu$m whereas resist thickness over the deep wide trench should be on the order of 2.0 $\mu$m; etching for 5 minutes will thus remove the 10,000 Å CVD $SiO_2$ layer over the deep narrow trenches whereas etching for 5 minutes will only remove 5,000 Å over the deep wide trench, taking the CVD $SiO_2$ coating down to the plane of the upper surface of the N− epi layer.

As earlier indicated, the simplest way to determine resist thickness necessary is to set process conditions, i.e., select the etching gas to be used, the temperature and the pressure to be used, coat the resist system to be used at varying thicknesses and thereafter plot amount of CVD $SiO_2$ etched versus time at varying resist thicknesses. Thereafter, the etch rate can easily be taken from such a curve.

As one skilled in the art will appreciate, photoresist thickness and silicon oxide thickness can vary greatly in accordance with the present invention and it is thus impossible to set exact bounds on these parameters since shortened processing time requirements will often lead to the use of a thinner photoresist layer(s). However, for silicon dioxide layers as are quite often planarized and which have a thickness of 1.5 to 3.0 microns, often a single layer of photoresist 0.2 to 3.0 microns provides good results whereas a plug/overcoat system where the plug has a thickness of equal to the depth of the trench and the overcoat has a thickness of 0.2 to 3.0 microns provides results quite acceptable on a commercial scale.

The etching gas used per the present invention is most preferably HF in anhydrous form.

The pressure of etching can vary widely, but for most commercial applications we have found pressures of about 2 to about 18 torr are preferred. Pressures substantially lower lead to an etch rate which might be considered to be too slow, whereas pressures much higher lead to an etch rate which is quite rapid, making exact process control more critical. On a commercial scale, processing between 2 and 18 torr in an anhydrous HF gas ambient offers acceptable results. While not limitative, typically we prefer to pass a flowing stream of anhydrous HF gas over the devices being etched at a pressure as above defined.

With respect to the temperature of etching, temperatures on the order of about 150° to about 200° C., more preferably 165° to 190° C., provide good results. Again, lower temperatures lead to a slower etch rate and high temperatures lead to a faster etch rate. Also, the possibility of photoresist degradation at very high temperatures exists. While higher and lower temperatures can be used so long as excessive photoresist degradation does not occur, i.e., degradation which effects the varying etch rate concept above explained, to date we see no substantial benefits to be gained by processing at excessively higher or lower temperatures.

Figure 7:
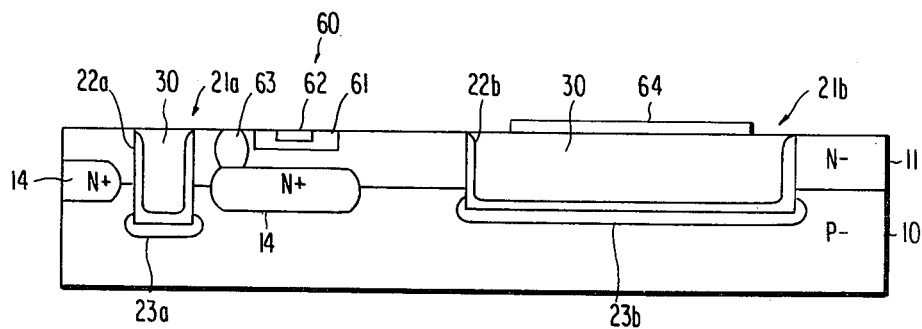

Following etching per the present invention and resist removal with a wet developer in a conventional fashion, a final product as shown in FIG. 7 is obtained where CVD $SiO_2$ layer 30 has been removed down to the top of deep wide trench 21b and deep narrow trench 21a i.e., where device planarization has been achieved. Shown in FIG. 7, for illustration, is bipolar transistor 60 comprising base 61, emitter 62 and collector 63, with metallization pattern 64 being shown overlying CVD $SiO_2$ layer 30 in deep wide trench 21b, all formed in a conventional manner.

Having thus generally described the present invention, a currently preferred mode of practicing the invention is set forth below. For simplicity, in the Example below active devices were not formed. However, since the active devices are protected by a $SiO_2$ layer similar to $SiO_2$ layer 12 above described during the processing of the present invention, their presence or absence has no effect on an understanding of the present invention.

Suffice it to say that the formation of such active devices follows conventional techniques in the art.

EXAMPLE

In this Example a device as shown in FIG. 6 was formed as earlier described except subcollector formation, reoxidation to form layers 22a and 22b and boron implantation to form isolations 23a and 23b were omitted as not essential to illustrate the invention. The deep trenches 21a and 21b were both 4–4.5 microns deep, with deep narrow trench 21a being 2–2.5 microns wide and deep wide trench 21b being 100 microns wide.

CVD $SiO_2$ layer 30 was formed in a conventional manner at 900°–1000° C. to a total thickness of 4–4.5 microns thereby filling deep narrow trench 21a and deep wide trench 21b. The CVD $SiO_2$ can be deposited with equal success from conventional wet or dry ambients, e.g., an $SiH_4$-$CO_2$-$H_2$ system, an $SiH_4$—$N_2O$-$N_2$ system, an $SiCl_2$-$H_2$-$N_2O$ system, etc.

Thereafter, AZ 1350 was coated over the entire surface of CVD $SiO_2$ layer 30 to a depth of 4–4.5 microns by conventional spin coating, whereafter the photoresist was masked, exposed in a conventional fashion to UV light and washed with AZ Developer for 10–15 minutes at room temperature, whereafter plug 40 as shown in FIG. 6 was formed in depression 31 as shown in FIG. 5. Plug 40 as shown in FIG. 6 had a total thickness or depth of about 4–4.5 microns.

Following the above procedure, KTFR was coated over the entire surface of the device by conventional spin coating to provide a thickness of about 1 micron, whereafter the KTFR was exposed to ultraviolet light in a conventional fashion over the total surface of the device, providing photoresist layer 50 as shown in FIG. 6.

Following the above procedure, etching was conducted.

Etching was conducted in anhydrous HF gas at a pressure of 18 torr at 165° C. for 50 minutes. In this instance HF gas was continuously passed over the device in an open system at a flow rate of 8 cc/min.

An etch ratio of about 4–5:1 was observed between the area over the deep narrow trench as opposed to the area over the deep wide trench. Since the etch ratio was about 4–5:1, 5 microns of CVD SiO$_2$ layer over the deep narrow trench 21A was removed whereas only 1 micron of CVD oxide over the deep wide trench 21*b* was removed in the 50 minutes of etching. The etch rate was approximately 200–250 Å/minute over the deep wide trench 21*b* and approximately 1200 Å/minute over the deep narrow trench 21*a*.

Following etching, the surface of the device was considered planarized, i.e., considered sufficiently planar so that no problems were encountered with the deposition of metallization patterns.

Following the completion of etching, the KTFR layer was first developed (removed) in an 80% xylene-20% cyclohexanone (v/v) developer and then washed with n-butyl acetate (room temperature; 10–15 minutes for development), whereafter the AZ 1350 J was removed using AZ Developer by washing for 10–15 minutes at room temperature followed by water washing.

In an alternate procedure, AZ 1350 J plug 40 as shown in FIG. 6 was not used, rather, only a KTFR resist was used. In this instance, however, it was necessary to use an 8 micron thick CVD SiO$_2$ layer 30 as shown in FIG. 6 to planarize at the conditions set forth above. This is one major disadvantage of using a single photoresist system, i.e., only thicker CVD SiO$_2$ layers can be used since variations in photoresist thickness primarily affect the etch rate.

While the invention has been described in detail and with reference to specific embodiments thereof, it will be apparent to one skilled in the art that various changes and modifications can be made therein without departing from the spirit and scope thereof.

What is claimed is:

1. A method for planarizing a non-level silicon dioxide layer which comprises at least one area (a) where a relatively high amount of silicon dioxide is to be removed and at least one area (b) where a relatively low amount of silicon dioxide is to be removed, said at least one area (a) and said at least one area (b) being non-level with respect to each other, said method comprising:

forming a first layer of a patterned HF permeable positive photoresist and a second layer of a negative HF permeable photoresist on said silicon dioxide, said combination of HF permeable photoresists providing a relatively rapid etch rate at said at least one area (a) and a relatively slow etch rate at said at least one area (b); and exposing said layers of said HF permeable photoresists and said silicon dioxide layer to HF gas at a pressure in the range of from about 2 to about 18 torr and at a temperature in the range of from about 150° C. to about 200° C., thereby etching and planarizing said silicon dioxide layer as said HF gas penetrates said HF permeable photoresists to relatively rapidly etch said at least one area (a) and relatively slowly etch said at least one area (b), said exposing to said HF gas and said etching continuing until said at least one area (b) and said at least one area (b) have both been etched so as to be substantially planar with respect to each other, wherein etching is completed prior to photoresist removal.

2. The method of claim 1, wherein said silicon dioxide has a thickness of 1.5 to 3.0 microns.

3. The method of claim 1, wherein said temperature is 165° to 190° C.

4. The method of claim 1, wherein said patterned HF permeable positive photoresist covers only said at least one area (b) and said negative HF permeable photoresist covers both said at least one area (a) and said at least one area (b).

5. The method of claim 4, wherein said patterned HF permeable positive photoresist and said HF permeable negative photoresist have different etch rates with respect to silicon dioxide.

6. The method of any one of claims 1, 2, 3, 4, or 5, wherein said at least one area (a) is in a deep wide trench and said at least one area (b) is in a deep narrow trench and wherein said silicon dioxide is conformal.

* * * * *